United States Patent [19]

Lowe

[11] 4,179,744
[45] Dec. 18, 1979

[54] METHOD AND APPARATUS FOR ANALYZING PERFORMANCE OF ELECTRIC-TRACTION-MOTOR POWERED VEHICLES AND ELECTRICAL OPERATING COMPONENTS THEREOF

[75] Inventor: Carl W. Lowe, Milford, Utah

[73] Assignee: Magtronics Incorporated, Milford, Utah

[21] Appl. No.: 882,864

[22] Filed: Mar. 2, 1978

[51] Int. Cl.² .................. G06F 15/20; G01R 33/02
[52] U.S. Cl. .......................... 364/551; 324/158 MG; 340/38 L
[58] Field of Search .............. 364/551, 554, 556, 565, 364/562; 340/567, 38 L; 324/158 MG, 244–260

[56] References Cited

U.S. PATENT DOCUMENTS

| | | | |
|---|---|---|---|
| 3,508,238 | 4/1970 | Baker | 340/38 L X |
| 3,573,441 | 4/1971 | Glazar | 364/562 |
| 3,639,731 | 2/1972 | McNeill | 364/551 X |
| 3,644,825 | 2/1972 | Davis, Jr. et al. | 340/38 L X |
| 3,732,405 | 5/1973 | Stewart | 364/554 X |
| 3,839,628 | 10/1974 | Higgins et al. | 364/551 |
| 4,052,595 | 10/1977 | Erdmann et al. | 340/38 L X |
| 4,138,642 | 2/1979 | Mohr | 324/158 MG |

FOREIGN PATENT DOCUMENTS

2420199  10/1974  Fed. Rep. of Germany ... 324/158 MG

Primary Examiner—Felix D. Gruber
Attorney, Agent, or Firm—Mallinckrodt & Mallinckrodt

[57] ABSTRACT

Magnetic fields of electrical operating components of electric-traction-motor powered vehicles, especially diesel electric and all-electric railway locomotives, are sensed as the vehicles pass given locations along their respective paths of travel, and the signals so obtained are processed to yield perceptible outputs, such as oscillograph charts or computer printouts, indicative of performance and any maintenance work that must be done for maximum utilization of available energy. In instances in which speed of the vehicle is a significant factor, that information is ascertained and utilized in the processing of the signals derived from sensing the magnetic fields. The apparatus comprises one or more magnetic field sensors, such as standard relay coils, strategically located with respect to the path of travel of the vehicle, and information processing equipment adapted to receive signals from the sensors and speed information, if significant, and to provide a perceptible output indicative of performance and any maintenance work required.

13 Claims, 13 Drawing Figures

METHOD AND APPARATUS FOR ANALYZING PERFORMANCE OF ELECTRIC-TRACTION-MOTOR POWERED VEHICLES AND ELECTRICAL OPERATING COMPONENTS THEREOF

BACKGROUND OF THE INVENTION

1. Field

The invention is in the field of methods and apparatus for checking operation of the power propulsion systems of vehicles that are powered by electric traction motors, especially diesel electric and all-electric railway locomotives.

2. State of the Art

It is common railway practice to couple several individual diesel electric or all-electric locomotives together in series to collectively form a single propulsion unit (often referred to merely as "the locomotive"), which is controlled by an engineer in the cab of the leading locomotive of the series.

While each individual locomotive has instrumentation for monitoring certain operating variables of its power propulsion system, it is very difficult for the engineer in the cab of the lead locomotive to determine whether all locomotives are operating properly. There are many instances in which one locomotive is not operating correctly or not at all, which means that that locomotive is being pulled along with the train as dead weight. This increases the work done and fuel consumed by the remaining locomotives. Furthermore, the defective locomotive may remain in service for some time, until a periodic physical check of the equipment shows that there is trouble.

Although several on-board instrumentation systems have been suggested heretofore to monitor the operation of a locomotive's propulsion system during travel, a separate system of this type must be individually installed in each locomotive of a propulsion unit and must be monitored accordingly.

Applicant is aware of only one proposal for analyzing performance of the propulsion system of a locomotive at a stationary location as the locomotive travels past that location, without requiring special equipment to be installed in the locomotive. That is as described in U.S. Pat. No. 3,445,648, and employs heat sensors to sense the temperature of various components of the locomotive as it passes by.

The temperature of exhaust gases from a locomotive and the temperature of the traction motors thereof provide some useful information as to performance, but there is much information of a more useful nature that is not provided by temperature readings.

While heavy automotive vehicles used in road construction and in mining often have traction motors powered by electricity generated by internal combustion engines, applicant is unaware of any attempt to check performance of the power propulsion systems of such vehicles by stationary, roadside instrumentation.

SUMMARY OF THE INVENTION

According to the invention, a performance analyzer for the power propulsion systems of vehicles, such as diesel electric and all-electric railway locomotives and heavy automotive vehicles utilizing electric traction motors, comprises stationary sensing means located adjacent to the pathway normally followed by such a vehicle, e.g. a railroad track or a roadway, and positioned to sense magnetic fields produced by selected electrical operating components of the propulsion system of the vehicle as such vehicle passes the sensing means. Signals from the sensing means representative of the magnetic fields sensed are suitably processed, which may include amplifying and filtering and modification based on vehicle speed, if significant, to produce perceptible outputs, such as oscillograph charts or computer printouts, which are indicative of performance of the system and of any maintenance work required for maximum utilization of available energy.

Correspondingly, the method of the invention comprises the steps of sensing the magnetic field or fields of one or more electrical components of the power propulsion system of an electrically propelled vehicle to produce a signal or signals indicative of the condition of the component or components concerned, and processing the signal or signals, either by themselves or along with modifying data indicative of vehicle speed during the sensing period, to produce a perceptible output indicative of vehicle performance and of any maintenance work required to insure maximum utilization of available energy.

Typical electrical operating components concerned are electric traction motors, main generators of alternator type, cooling fan motors, and auxiliary alternators. Any one or more of these components may be selected for analysis in accordance with the invention.

Normally, the traction motors and the main generator, if of alternator type, will be selected for analysis. However, if the main generator is not of alternator type, the cooling fan motors will normally be selected in place of the main generator. By sensing and analyzing the magnetic fields of all these components of a power propulsion system, performance of the system as a whole can be quite fully determined.

Performance of such a system can be adequately but not quite as completely determined by sensing and analyzing only magnetic fields produced by the traction motors. Useful information as to performance may also be obtained by sensing and analzying only the magnetic field produced by the main generator or by some other single operating component of the system.

The sensing means will normally comprise individual sensors, such as stationary coils of wire in which electrical currents indicative of the magnetic fields concerned will flow as the magnetic fields pass by. Sensors for the respective magnetic fields produced during operation of traction motors will normally be located directly in the pathway followed by the vehicle, so that the traction motors pass over such sensors. If a railway locomotive is the vehicle concerned, the sensors will be located between the rails of the track. A sensor for the magnetic field of the main generator will normally be located alongside the path of travel of the vehicle at the approximate height of the main generator. As applied to railway locomotives of customary type, the sensor for the main generator will be located alongside the railroad track at a height of approximately 8 to 14 feet above the rails. When several sensors are employed, they are preferably located so that the vehicle passes by all simultaneously.

It will usually be advantageous, particularly with railway locomotives, to ascertain the speed of the vehicle as it passes the sensing means and to utilize this information in connection with the information obtained by the sensing means. The speed may be determined by merely having the sensing means located in a zone in which all vehicles must travel at a set speed, or by appropriate communication from the engineer or driver, or, preferably, by a speed detecting and measuring device which will determine the vehicle's speed as it passes the sensing means and will appropriately communicate the information to the signal processing equipment. It may also be calculated from oscillograph charts when these are used to record the information derived from the sensed magnetic fields.

The analyzer and method of the invention are useful for indicating, among other things, whether or not particular electrical power propulsion devices included in the power propulsion system of a vehicle, usually a locomotive, are operating properly or at all; whether or not a locomotive has reached and successfully passed transition; whether or not a locomotive is experiencing a condition commonly called "wheel slip"; whether or not proper gear ratios in the power trucks of a locomotive have been used, and whether or not dynamic brakes of a locomotive are operating properly. The invention may also be used for determining engine horsepower and RPM.

THE DRAWINGS

In the accompanying drawings, which illustrate the best mode currently contemplated of carrying out the invention.

DETAILED DESCRIPTION OF THE ILLUSTRATED EMBODIMENTS

There is illustrated in the drawings apparatus specifically adapted to analyze performance of railroad diesel electric and all-electric locomotives.

Figure 1:
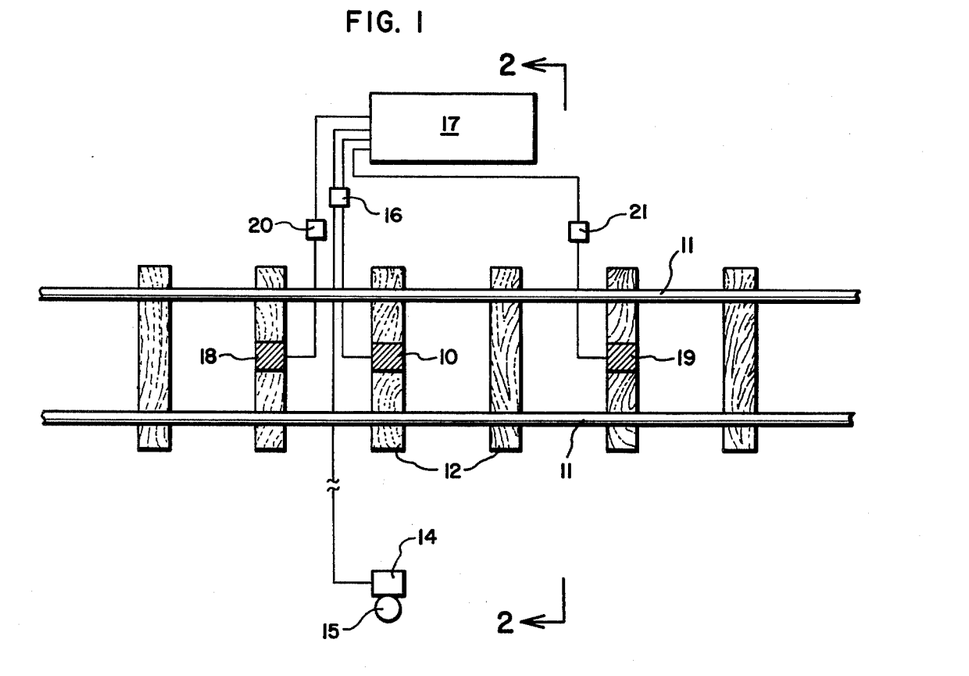
FIG. 1 represents schematically a top plan view of apparatus of the invention showing a portion of a railroad track, magnetic field sensing means, speed determining sensors, and signal processing means.
Figure 2:
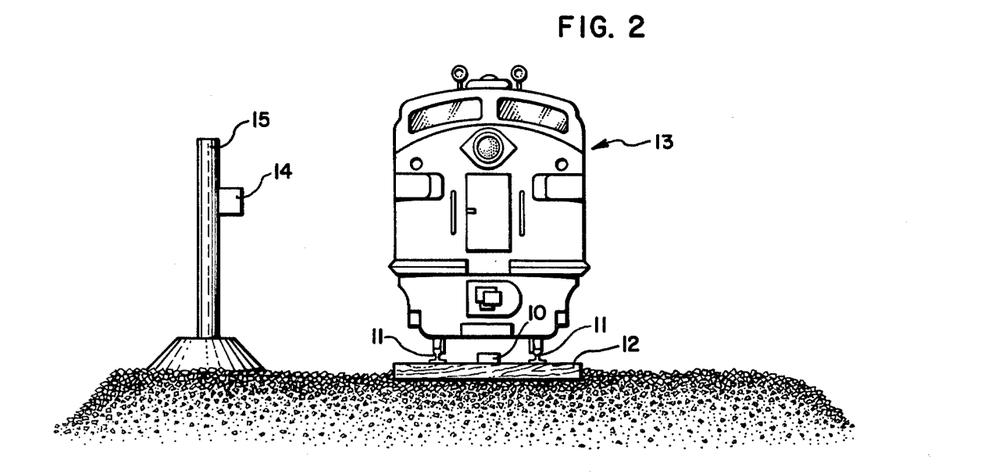
FIG. 2, a transverse vertical section taken along the line 2—2 of FIG. 1 and showing a diesel electric locomotive on the track and approaching the apparatus of the invention.

As shown in FIGS. 1 and 2, magnetic field sensing means include a stationary sensor 10 positioned between the rails 11 of a railroad track. Such sensor is preferably mounted on and firmly secured to the top of one of the ties 12 of the track, as illustrated, or it can rest in or on the balast between the ties and the rails and be anchored securely in any suitable manner. Preferably, the top of sensor 10 will be approximately four inches below the tops of rails 11 when mounted on a tie as shown.

Standard diesel electric and all-electric locomotives used by railroads today have electric traction motors mounted in and powering trucks of the locomotive. Such traction motors are normally mounted adjacent to and parallel with respective axles of respective trucks. There is generally one traction motor provided to power each axle in a truck, and such trucks normally have either two, three, or four axles. Usually, each locomotive has two trucks, both powered, so there are normally from four to eight traction motors powering each locomotive. Several locomotives coupled together are normally used as a propulsion unit and are often referred to collectively as "the locomotive" of a given train.

Since the traction motors are truck-mounted, they are relatively near the track and normally centrally of the rails. They are generally located approximately seven inches above the tops of the rails and will thus pass over and come within approximately one foot of the track-mounted sensor 10 when a locomotive, such as that shown at 13 in FIG. 2, passes along the track.

The poles of a D.C. electric traction motor create a magnetic field when operating. The magnitude of the magnetic field will usually be proportional to the current flow in the motor, and the current flow can indicate various operating characteristics of the motor, such as power output. Sensor 10 may be of any suitable type adapted to respond to the magnetic fields produced by the poles of the traction motors as they pass over it. A coil of wire, especially one wrapped around an iron core, has been found to be very satisfactory as a sensor of the magnetic fields concerned. As a practical matter, a commercial electrical relay is preferably employed as a sensor, the coil thereof being the part utilized and the switch thereof being extraneous and present only because it is part of the commercial device that is more readily obtainable on the open market than is merely a coil.

In order to measure magnetic fields produced by other electrical operating components of the power propulsion system, such as the main generator (if of alternator type) or the cooling fan motors (if the main generator is not of alternator type), the sensing means includes a stationary sensor 14 mounted on a post 15 alongside the railroad track, so locomotives running along the track will pass by it. Sensor 14 may have its own support, as shown, or may be mounted on a standard, trackside structure, such as a signal mast. It will have appropriate clearance relative to the track, e.g. nine feet from the nearest rail, and is preferably located in approximately the same vertical plane as sensor 10 so that a locomotive will pass both sensors simultaneously. It may be and preferably is similar in nature to sensor 10.

The shape of and orientation with respect to the travel of the vehicle of any coil or other type of sensor used will have some bearing on the strength and character of signal obtained from the sensor. There may even be some orientations of the sensor that will not yield usable signals. Accordingly, in carrying out the present invention, the operator should try different orientations of a particular sensor in any given situation to determine the most effective orientation for the particular sensor utilized.

Most newer locomotives have an alternator type of main generator which produces an alternating magnetic field. This type of main generator produces a magnetic field indicative of alternator frequency which is an indication of diesel engine revolutions per minute and of current output. In older locomotives having D.C. main generators, no useful magnetic fields are produced by such generators. Thus, for these older locomotives, the magnetic field of the A.C. cooling fan motor or of the auxiliary alternator is sensed to obtain an indication of the frequency of the auxiliary alternator, which, in turn, is an indication of diesel engine revolutions per minute. Since the cooling fan motor normally has less shielding about it than does the auxiliary alternator and is in a better position to be sensed, it is normally selected for sensing as against the auxiliary alternator.

Magnetic fields produced by cooling fan motors and those produced by auxiliary alternators are of much smaller amplitude than are the fields produced by alternator type main generators and are overpowered by the magnetic fields of the latter. Thus, they are of no concern unless the main generator of a locomotive is of D.C. type.

The main generator in most locomotives is located approximately eight feet above track level and the cooling fan motor is located approximately fourteen to eighteen feet above track level. Despite this, it has been found that a sensor 14 located alongside the track somewhere between eight and fourteen feet above track level is capable of effectively reacting to the magnetic field of the main generator, if of alternator type, or of the cooling fan motor or auxiliary alternator if the main generator is of D.C. type.

Output signals from the sensing means (currents induced momentarily in the coils) are fed to suitable processing means for producing perceptible outputs indicative of the performance of a locomotive's power propulsion system. Such processing means may be located alongside the track near the sensing means, may be at a remote location, or may be split between the two. The output signals fed to the processing means will usually need to be amplied before other processing takes place, and it is usually preferably to locate amplifying means as close as possible to the sensing means so that signals from the latter can be amplified above noise level before noise is introduced into the signals. Although in appropriate instances an amplifier may be closely coupled to a sensor, in the case of sensor 10 located on a tie 12 an amplifier 16 is located trackside. If mounted on the ties together with sensor 10, it would be subject to severe vibration as a train passed over it. However, since sensor 14 is located outside the vibration zone, it preferably incorporates an amplifier in the same package. However, its signals may be passed through and further amplified by a separate channel of amplifier 16 if desired. It should be noted that the leads between sensors and amplifiers should be kept as short as possible to minimize pickup of noise by the connecting wires, which are preferably coaxial cables to further reduce any tendency to pick up noise.

Signals from amplifier 16 are fed into processing means 17 to produce perceptible outputs that are dependent in kind on the type of processing means employed. Such processing means may be an oscillograph or similar recording device with necessary circuitry to make the signals from amplifier 16 compatible therewith, as contemplated by the embodiment of FIG. 3, or may be a computer or microprocessor which analyzes the signals fed thereto and prints out any malfunctions of the locomotive components whose magnetic fields are sensed. If the latter, the computer information may be stored for future printout or future use. Processing of the signals from the amplifiers may be done locally at trackside or remotely. If remotely, the signals are transmitted over wires or by radio to the remote location or locations.

FIG. 1 shows speed-detecting means in the form of sensors 18 and 19 located between rails 11 of the track and respectively spaced from sensor 10 in opposite directions therefrom longitudinally of the track. These sensors 18 and 19 are connected, respectively, to trackside amplifiers 20 and 21 and to the signal processing means 17. They are provided to measure the speed of a locomotive as it passes over sensor 10, as will be explained later herein.

Figure 3:
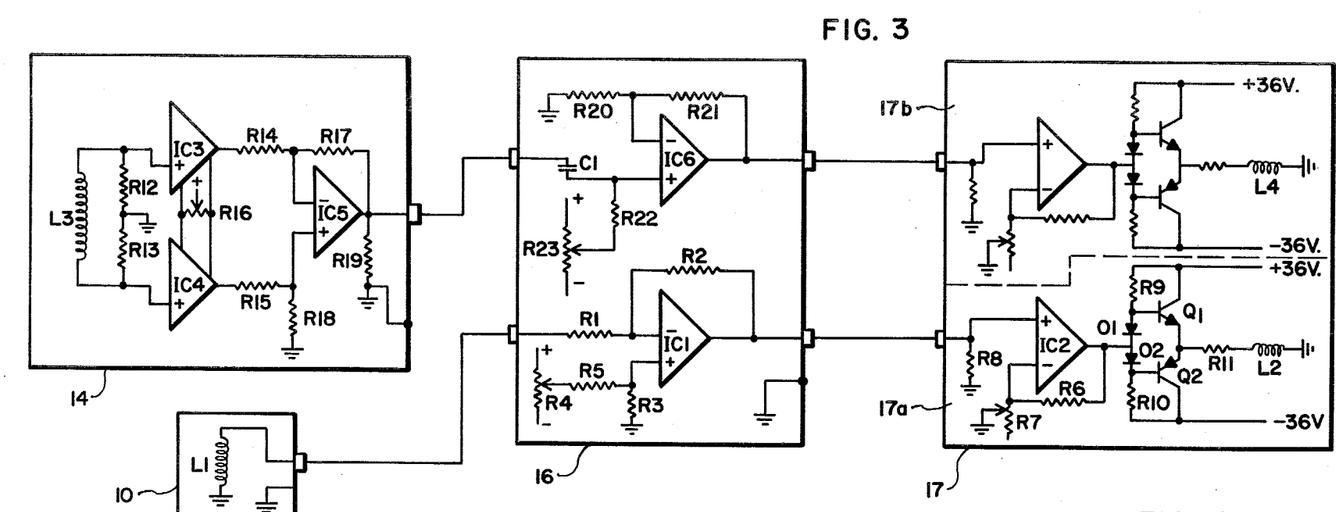
FIG. 3, an electrical circuit diagram applicable to the apparatus of FIGS. 1 and 2, wherein an oscillograph provides readout and locomotive speed, however ascertained, may be taken into consideration when evaluating the chart recordings constituting the oscillograph readouts.

A specific embodiment of the processing means 17, that produces an oscillograph readout (perceptible output) in the form of charts, is shown in FIG. 3. Both of the magnetic field sensors 10 and 14 used in this particular embodiment are AMF, Potter & Brumfield, V-200, 12-volt, thin line relays having 200 ohm coils. The coils serve as the sensors.

The relay coil of sensor 10 is represented by coil L1. The output of coil L1 is connected through coaxial cable to an amplifier comprising resistors R1 through R5 and operational amplifier IC1. The amplifier is the basic inverting amplifier circuitry shown on page AN-20-1 of the National Semiconductor Handbook "Linear Applications". Volume 1. The amplifier is designed to have a gain of 100, which is achieved by making R1 equal to one K ohms and R2 equal to 100 K ohms. R3 is one K ohms. Variable 50k resistor R4 and 200k resistor R5 provide a compensation network to adjust and reduce the offset voltage of the operational amplifier IC1. IC1 may be any suitable operational amplifier, such as a National Semiconductor LM307. However, a National Semiconductor LM107 can be used to increase the reliability over a wider temperature range.

The output of IC1 is recorded on a standard oscillograph, preferably on one channel of a two-channel oscillograph. Oscillographs with built-in amplifiers may be operated directly from the output of IC1. Other oscillographs, such as the Brush oscillograph model RD2622, must have an external amplifier provided. Brush recommends that a Brush amplifier be used. It has been found, however, that the circuitry shown in block 17 of FIG. 3 is satisfactory. The first channel of the oscillograph and amplifier therefor are indicated by section 17a of block 17.

IC2, R6, R7, and R8 form a standard non-inverting amplifier as described on page AN20-2 of the before-referred-to Handbook. IC2 may be a National Semiconductor LM143, R6 100 K ohms, R7 50 K ohms, and R8 one K ohms.

The output of IC2 is connected through diodes D1 and D2 to the bases of transistors Q1 and Q2. Resistors R9 and R10 are biasing resistors for transistors Q1 and Q2, and resistor R11 is a current limiting resistor for the pen-driving motor (represented by coil L2) of channel 17a of the oscillograph. Transistor Q1 may be an RCA, Sk3024, Q2 an RCA Sk3025, R9 and R10 may be 10 K ohms, and R11 may be 47 ohms. Any diode with a reverse voltage rating of over 50 volts may be used for D1 and D2.

The relay coil of sensor 14 is represented by coil L3. Both sides of coil L3 are connected to ground through 22 meg ohm resistors R12 and R13. The voltages across resistors R12 and R13 serve as inputs to a standard differential-input instrument amplifier substantially as shown on page AN31-9 of the before-referred-to Handbook. The amplifier comprises voltage followers IC3 and IC4, resistors R14 through R18, and operational amplifier IC5. It is designed to have a gain of 500. Resistors R14 and R15 are 200 ohms, variable resistor R16 is 1 K ohms, and R17 and R18 are 100 K ohms. IC3 and IC4 are National Semiconductor LM310's and IC5 is a National Semiconductor LM307. Again, National Semiconductor LM110's and an LM107 could be used for operation over a wider temperature range. Resistor R19 is a 10 K ohm resistor connected between the instrument amplifier output (the output of IC5) and ground.

The ouput of IC5 is sent to a standard non-inverting amplifier (page AN20-2 of before-referred-to Handbook) which is located in block 16 and designed to have a gain of 100. This amplifier is made up of operational amplifier IC6 and resistors R20 and R21. Resistor R22 and variable resistor R23 form a compensation network to reduce the offset voltage of IC6. The amplifier is coupled to the output of IC5 through capacitor C1 which acts as a high pass filter so that IC6 amplifies only the AC component of any signal from IC5. This blocks any signals from sensor 14, which represent passage of merely the mass of the engine or of a D.C. generator and which are not oscillating signals. IC6 may be a National Semiconductor LM307 or LM107; R20 and R22 may be 100 K ohms; R21 may be 10 meg ohms; R23 may be a 50 K ohms potentiometer; and C1 may be 0.1 microfarads.

The output of IC6 is recorded by the second channel of the oscillograph, which, together with an amplifier therefor, is included in section 17b of block 17. The circuitry of section 17b is identical with that of section 17a, which has previously been described in detail. Coil L4 represents the pen-driving motor of this second channel 17b of the oscillograph.

As previously indicated, the oscillograph provides a permanent record, in the form of charts, of the magnetic fields sensed by the sensing means.

In all but the newest railroad locomotives (the newest locomotives have main generator outputs of 1400 volts rather than the 900 to 1000 volts that was common in older locomotives), a locomotive starts and, at low speeds, runs with several of the traction motors connected in series. In this way, the large currents needed for starting torque are obtained. As the locomotive increases its speed, so that the back EMF of the traction motors builds up, the fields of the motors are shunted with resistors to decrease the field current and reduce the back EMF across the field, thereby increasing the armature current. As the speed of the locomotive further increases, the traction motors are changed from the series shunt connection to a parallel connection, and then, finally, to a parallel shunt connection.

It has been found that most meaningful information can be obtained by the magnetic field sensing means during periods when the traction motors are connected in either series or in parallel, without having the field shunted. By examining the operating characteristics of the numerous types and models of diesel electric locomotives in use on railroads of the United States, it is found that virtually all of the locomotives have their traction motors connected in series, without field shunting, between the speeds of 0 and 17 miles per hour and have their traction motors connected in parallel, without field shunting, between the speeds of 35 and 43 miles per hour. Outside of these ranges, shunting is present in various of the locomotives. The major exceptions in the lower range are some SD type locomotives which have their fields shunted between the speeds of 11 and 15 miles per hour. Thus, in order to obtain the most useful readings for any and all of the various types of locomotives that may be connected to a train passing the sensing means described, the train should be traveling at a speed in the 35 to 43 miles per hour ranges.

Figure 9:
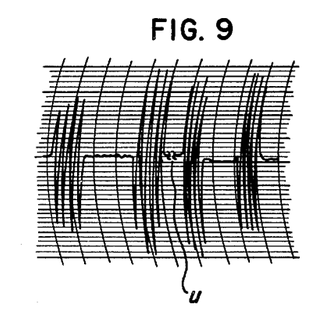
Figure 10:
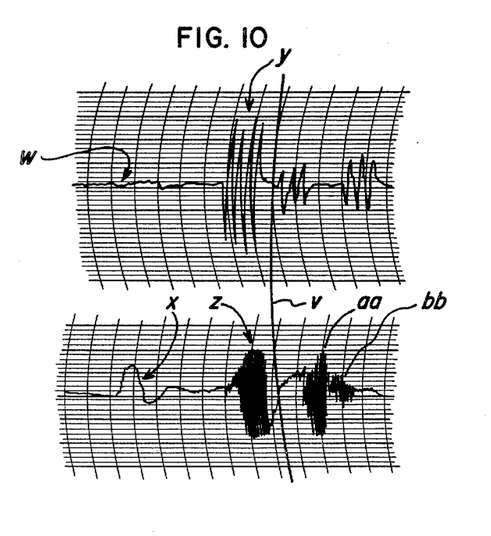
Figure 11:
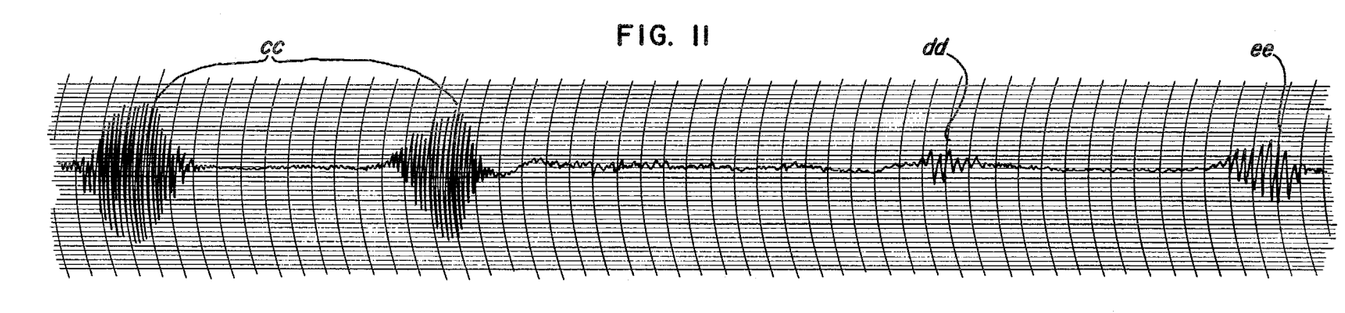

FIGS. 4 through 11 show reproductions of actual charts made by the apparatus of the invention using the circuitry and oscillograph shown in and described for FIG. 3. The upper charts in FIGS. 4 and 10 and the charts of FIGS. 5-9 are produced by one channel of the oscillograph and show respective outputs of sensor 10, which represent the magnetic fields of the traction motors. The lower charts in FIGS. 4 and 10 and the chart of FIG. 11 are produced by the other channel of the oscillograph and show respective outputs of sensor 14, which represent the magnetic fields of main generators of alternator type.

Figure 4:
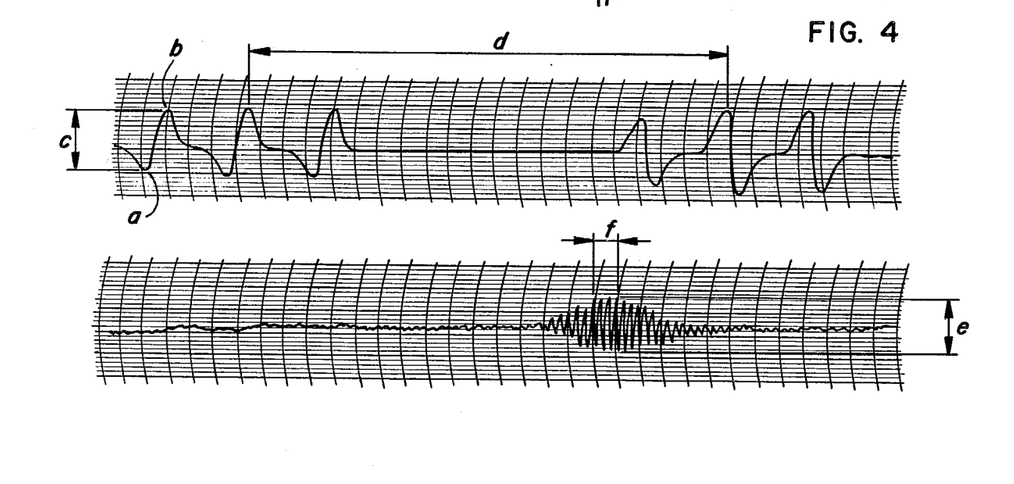
FIGS. 4 through 11, representations of typical chart recordings constituting perceptible outputs of the circuitry of FIG. 3 for various magnetic fields sensed by the apparatus.

The upper chart of FIG. 4 shows the outputs of sensor 10 for an SD40-2 type of locomotive having three traction motors per truck. Reference letter "a" indicates the recording made for the reading taken of the south pole of the first traction motor to pass over sensor 10. Reference letter "b" indicates the recording made for the reading taken of the north pole of that same traction motor. Similarly, the corresponding recordings appearing in subsequent portions of the chart are for readings taken of the south and north poles of the second and third traction motors of the truck and of corresponding poles of successive motors of subsequent trucks of the locomotive. The peak-to-peak spread between the south and north pole recordings for each traction motor indicates the amount of current flowing through the motor. Reference letter "c" indicates this spread for the first traction motor.

Reference letter "d" represents the distance between the center traction motor on the first truck and the center traction motor on the second truck (could also be taken between first traction motors or between last traction motors of such trucks). When the type of engine is known in connection with such a chart, the distance "d" is readily ascertained, and, by knowing the time period occurring between the sensing of these two points (the number of divisions along the chart—here 21.1 divisions—with the chart running at 125 millimeters per second and there being 5 millimeters per division, gives 0.84 seconds as the time), the speed of the train can be easily determined. For the SD40-2, the distance "d" is 40.75 feet. Therefore, the speed of the locomotive as it passed the sensor was just less than 33 miles per hour. Here it should be noted that the SD40-2 locomotive does not have field shunting, so readings may be taken at any speed.

In evaluating this chart of FIG. 4, it is seen that the amplitude of the peak-to-peak spread "c" for each traction motor is approximately the same, which indicates that all traction motors of such trucks are presently operating correctly. Nonetheless, the lesser amplitude of "c" for the first traction motor of the second truck indicates that either that traction motor is turning slightly faster than the others, therefore drawing less current, or that such motor is being supplied with slightly less current because of a contactor that is starting to go bad or because of slightly higher internal motor resistance compared to the other motors. With this knowledge, the locomotive can be more definitively considered during the next of usually periodic shop checkups.

The increased speed of rotation of the particular traction motor noted above is probably due to wear of the drive wheels, causing them to be slightly smaller in circumference than the other wheels and therefore to turn faster at the same speed. The Federal Government and the railroads have certain allowable limits for wheel wear in certain locomotives. Before wheels are replaced, they are usually allowed to wear until these limits are reached. In some cases, allowable wear may reduce the diameter of a wheel up to three inches and such variation in wheel diameters can easily cause a much greater difference in amplitude than that shown. Because of this, railroads are continuously checking locomotive wheel size and trying to keep wheel size substantially equal. When difference in amplitude caused by the difference in wheel size reaches a certain point, the locomotive goes into an undesirable condition called "wheel slip" that is explained hereinafter in connection with FIG. 7. This condition should be avoided, thus the importance of matching wheel sizes. Outputs obtained by the present invention show when wheel size differences become critical and indicate which wheels need matching.

The lower chart of FIG. 4 shows the information output for sensor 14, which operates simultaneously with sensor 10 but senses the magnetic field of the alternator type, main generator of the same locomotive. Reference letter "e" indicates the peak-to-peak amplitude of the signal and represents the current output of the generator. Letter "f" indicates the number of cycles of oscillation occurring in a given time unit, here one division of 5 millimeters. This is a measure of the frequency of oscillation of the signal, which represents the frequency of the generator. The diesel engine is directly coupled to the generator, so engine RPM can be calculated.

Practically all of the alternator-type main generators in service on railroads in the United States have ten poles and thus produce five cycles of current output for each revolution of the diesel engine. Therefore, the cycle per second output of the alternator can be multiplied by the factor twelve to give directly the revolutions per minute of the diesel engine. The drawing shows three complete cycles in the space of five millimeters, which represents one twenty-fifth of a second. This gives a frequency of 75 cycles per second and, converted, gives 900 RPM for the diesel engine. This indicates that the engine is running properly at full RPM.

The relative positions of the main generator and the trucks of the locomotive indicate the direction the locomotive is traveling. Here the main generator is closest to the truck that is the second one to pass over the sensing means. The end of the locomotive at which the main generator is located is usually considered the front of the locomotive (e.g. by the Union Pacific Railroad). Therefore, the locomotive analyzed in this instance is traveling backwards and the traction motor sensed first (the one on the left) is the sixth from the front of the locomotive. Some railroads consider the other end of the locomotive as the front, and, in such a case, the first traction motor sensed would be the number one motor. The designation is helpful so that if a malfunction is detected, the motor having the malfunction can be easily specified.

Figure 5:
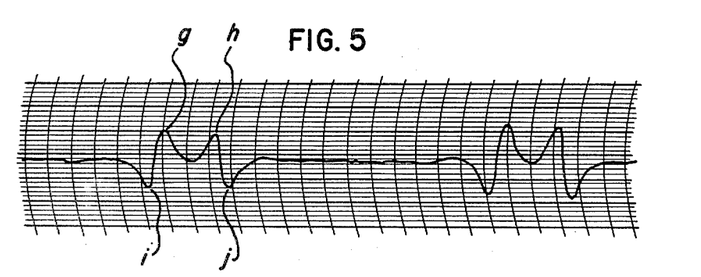

The chart of FIG. 5 shows the information output for a GP 30 A type of locomotive. Only signals from sensor 10 were taken and recorded. In this type of locomotive, instead of each traction motor of a power truck being arranged with similar pole orientation, as in the SD40-2, each is arranged oppositely. This is seen in the chart, where reference letter "g" indicates the reading for the north pole of the first traction motor and letter "h" indicates the reading for the north pole of the second traction motor. The south pole readings are indicated by letters "i" and "j" respectively.

Since the amplitude of the readings for each traction motor are substantially equal, the chart indicates that the locomotive unit is operating properly. It was taken at a train speed of 35 miles per hour.

Figure 6:
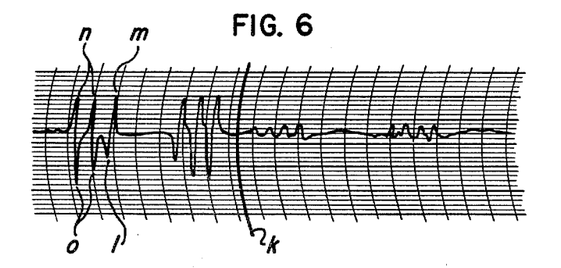

The chart of FIG. 6 shows the information output from sensor 10 for an SD40-2 type locomotive and a DD35 type locomotive, the two locomotives being connected as part of a single propulsion unit. The chart speed was 25 millimeters per second, rather than the 125 millimeters per second of FIGS. 4 and 5, and the positive and negative leads were interchanged so that south poles are indicated above the center line of the chart rather than below. The train was traveling at a speed of 29 miles per hour. The readings to the left of line k are those taken for the SD40-2 locomotive, while those to the right are those taken for the DD35.

The output for the third traction motor of the first truck of the SD40-2 locomotive shows that its pole orientations are opposite to the remaining traction motors of that truck. Thus, the third traction motor's north pole reading, (letter "l") comes before its south pole reading (letter "m"), while, for the first two traction motors, the south pole reading (letter "n") comes before the north pole reading (letter "o"). This reading indicates that the field and armature connections of the third traction motor have been incorrectly connected (all traction motors of a truck should have the same orientation for the SD40-2 locomotive).

At 29 miles per hour, the DD35 locomotive has its fields shunted. The shunted fields produced the poor readings shown.

Figure 7:
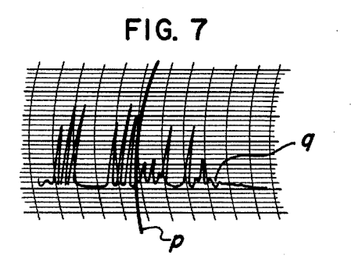

The chart of FIG. 7 shows information outputs for two SD45 locomotives connected as part of a single propulsion unit, the readings for one locomotive being to the left of line "p" and the readings for the other to the right. The signals from sensing means 10 had been rectified, so only the positive readings were recorded by the oscillograph.

The output to the left of line "p" indicates differences in traction motor current amplitudes that are probably due to differences in wheel size because of wheel wear, but otherwise indicates that the locomotive is operating properly.

The output to the right of line "p" shows substantially different readings for the traction motors of the other locomotive, there being essentially no reading for the last traction motor (see the letter "q"). This indicates a fault in the last traction motor, which, on checking the locomotive, was found to be a bad contactor. This means that that motor was not effectively connected to a source of power and was not contributing to propulsion of the locomotive. Moreover, the substantially different readings obtained for the first five traction motors indicate that the unit is in the condition called "wheel slip".

"Wheel slip" is indicated by an unbalanced electrical differential between traction motors of a unit, which causes a "wheel slip" relay to actuate and reduce power from the main generator to the traction motors. With the power to the motors reduced, the imbalanced condition no longer exists. Power is then restored gradually to the traction motors, generally over a period of milliseconds. If actual "wheel slip" has occurred, the reduction of power to the traction motors allows the wheels to regain traction, and, when the power is restored, the wheels should maintain traction and not slip again. However, the "wheel slip" relay reacts to any unbalanced electrical condition, not just actual "wheel slip".

In the present instance, the lack of power to the last traction motor caused by the bad contactor created an unbalanced condition, which activated the "wheel slip" relay each time power was applied to the traction motors. Thus, as power built up, the relay was activated and the power was reduced. Since in reacting to "wheel slip", power is restored over a period of milliseconds, and, since the signals are taken and recorded sequentially, the variations in amplitude showed the power buildup and reduction. When a locomotive unit is in a "wheel slip" condition, as indicated, it is not helping to power the train. Thus, such a condition should be corrected as promptly as possible.

Figure 8:
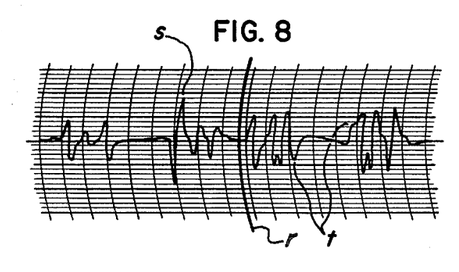

The chart of FIG. 8 shows information output for an SD40-2 locomotive and an SD40 locomotive connected as part of a single propulsion unit and traveling at 29 miles per hour.

The readings to the left of line "r" are those for the SD40-2 locomotive. Letter "s" indicates the reading for the fourth traction motor (first motor of the second truck) and is of much greater amplitude than the readings for the remaining traction motors. This indicates that the fourth traction motor is drawing much more current than the remaining motors. A cause of this condition could have been that such fourth traction motor was turning much more slowly than the remaining motors. Such a slower rotation is caused by the existence of a different gear ratio for that motor than for the remaining motors. In this instance, examination revealed that the fourth motor had a high speed gear ratio, while the other motors did not. All motor ratios should be the same. Thus, this chart of FIG. 8 reveals an unbalanced condition which would normally cause the unit to go into "wheel slip". However, it was found that the "wheel slip" circuit was not operating on this locomotive, so no indication of "wheel slip" is shown by the chart.

The readings to the right of the line "r" are for the SD-40 locomotive and indicate normal operation. It should be noted that, while all pole orientations are the same in a single truck of an SD40-2 unit, this is not the case in the SD40 unit. As the readings indicate, the inside motors on each truck have an opposite orientation to that of the other two motors of the truck. The readings indicated by letter "t" do not represent fields of the traction motors, but are peculiar to this type of locomotive and probably represent the magnetic mass of the locomotive's main generator.

The chart of FIG. 9 shows information output for a DD40X locomotive. This type of locomotive has four axles and four traction motors per truck. It also has two diesel engines and two main generators, one associated with each engine.

The readings to the right of break "u" are readings for the same locomotive as the readings to the left of the break, but taken ten days later and with the locomotive traveling in the opposite direction. Thus, the last reading to the left of the break is for the same traction motor as the first reading to the right of the break.

The first readings taken for the locomotive show that the traction motors of the first truck are drawing less current than those of the second truck. If readings for the main alternators had been taken, they would have shown less than rated output obtained from the first diesel engine. The problem was found to be a dirty fuel filter in the fuel line to the first diesel. The readings taken for the same unit ten days later, after the fuel filter had been changed, show normal operation.

The upper chart of FIG. 10 shows, to the left of line "v", information output for a DD40X locomotive and, to the right, information output for an SD40-2 locomotive. The upper chart represents signals taken by sensor 10 and the lower chart signals taken by sensor 14. Letter "w" on the upper chart indicates what should be readings for the first truck of the DD40X locomotive. The absence of definitive readings indicates that the traction motors are not working. The letter "x" on the lower chart indicates what should be readings for the main generator of the DD40X locomotive associated with the first truck (the DD40X locomotive has two diesel engines). Although the wave form shown represents the passage of the main generator mass, it indicates the generator is not working and not producing any output. The normal traction motor readings for the DD40X are shown or the second truck at "y" and for the second main generator at "z". These charts thus indicate that none of the traction motors of the first truck of the DD40X locomotive were working. The reason was found to be that one main generator of that locomotive was not working, as indicated by the chart.

The readings for the SD40-2 locomotive are to the right of line "v" and indicate that it was working properly. The readings designated by the letters "aa" are for the main generator (alternator type) and the readings designated by the letter "bb" are for the cooling fan motor. As indicated previously, if the main generator is not of the alternator type, no reading would show up for such main generator and only the reading for the cooling fan motor would be present. Although amplitude information on generator current output cannot be determined from cooling fan motor readings, the frequency of the cooling fan motor can be determined in a manner similar to that described for the main generator frequency referred to in connection with FIG. 4. From that frequency, the RPM's of the diesel engine in the locomotive may be determined. Rather than the conversion factor of 12, however, a factor of 7.5 is used to convert cycles per second of the cooling fan motors directly to revolutions per minute for the diesel engine. Thus, 120 cycles per second converts to 900 RPM, full speed for that engine.

It is preferred, particularly for most main generator readings, that such readings be taken at full throttle. At full throttle, the diesel engine is operating at full horsepower and full RPM. At less than full throttle, the diesel engine is operating at less than full RPM, so that an RPM reading obtained from main generator frequency will not be meaningful unless the throttle setting and normal diesel RPM at that setting is known.

By placing the sensing means at a location immediately following a reduced speed zone, at which location a train will be accelerating from the reduced speed (usually, except in some adverse weather conditions, train acceleration is done at full throttle), readings at full throttle and at approximately the desired speed may be obtained.

The chart of FIG. 11 shows information output for the main generators of a DD40X locomotive, the main generator of an SD40-2 locomotive and for one generator of a second DD40X locomotive, these locomotives being connected together as part of a single propulsion unit. The readings were made from signals taken by sensing means 14.

The readings for the generators of the first locomotive (a DD40X has two diesel engines and two main generators), indicated respectively by letters "cc" show main generator frequency of 600 RPM. The reading "dd" for the generator of the SD40-2 locomotive shows a main generator frequency of 300 RPM, and the reading "ee" for the one generator of the second DD40X locomotive shows a main generator frequency of 360 RPM. Both of these readings represent the normal idling RPMs for the diesel engines concerned.

The signals for the information output of FIG. 11 were taken on a long, relatively flat stretch of track, where a minimum of power is required to keep the train moving at the desired speed. The readings indicate that the engineer of the propulsion unit was properly operating the locomotives of such propulsion unit under a new fuel saving program wherein a special fuel saving device allows the engineer, when the train is up to a desired speed, to maintain that speed by operation of only one of the locomotives of the power propulsion unit, the remaining locomotives merely idling. Thus, here the first locomotive was shown to be properly running at less than full throttle and the other two locomotives at idle.

For readings such as those of FIG. 11, where proper use of fuel saving devices and practices are monitored, the sensing means is placed at a location where such practices would normally be effective, and not at a location where a train would normally be accelerating. Likewise, where the invention is used to monitor operation of the dynamic brakes of a power propulsion unit, the sensing means would be placed at a location on a downgrade, where the brakes would normally be in use. Sensing means located on such a grade could be used, as well, to analyze locomotives running at full throttle up the grade.

In dynamic braking, the traction motors of the locomotive are used as generators. The signals obtained by sensor 10 for the traction motors in the dynamic braking mode are similar to the signals taken for the traction motors in their power mode, in that readings for both north and south poles are obtained. The presence of readings of similar amplitude indicates correct operation, while absence of readings or readings of very low amplitude for one or more of the traction motors used in the braking mode indicate improper operation or non-operation.

The system of the invention can also be used in conjunction with automatically operated railroads, such as recently constructed, rapid transit systems, to indicate, for example, whether locomotive power has been reduced to proper levels or shut off at desired points, such as when entering a station or other reduced speed zone or when the end of the line has been reached, as well as to indicate whether a locomotive is operating properly.

The charts of FIGS. 4 through 11 are actual information outputs showing normal and some abnormal locomotive conditions typical of railroad operation. Because of the numerous locomotive types and the numerous malfunctions that can occur, these showings represent only a small number of the actual variations that can occur in such charts. Experience will enable an operator to readily spot a wide variety of possible difficulties and repairs necessary to correct such difficulties in maintaining power propulsion equipment in top condition.

The amplitude of the readings are influenced by two factors, particularly when using a coil-type sensing means. The first factor is the amplitude of the magnetic field being measured; the second is the speed of the unit being measured. The faster the magnetic field passes the coil, the larger the amplitude of the output. This is because the passing magnetic field generates a current in the coil in the same manner as in a conventional generator. The current generated is a function of the change of the magnetic field about the coil. For a given magnetic field being sensed, the change in magnetic field about the coil is greater if the field moves by at a greater speed. However, it should be noted that increases in strength of the magnetic field about the sensor coil caused by increases in speed are counteracted by the reduced strengths of the magnetic fields created by the traction motors. As the speed of the traction motors increases, less current flows through the motor and less magnetic field is created.

In many instances, it will be advantageous to have the signals from the sensing means evaluated by a computer to produce an output indicating whether or not a particular vehicle is operating properly, and, if not, the nature of the problem.

Figure 12:
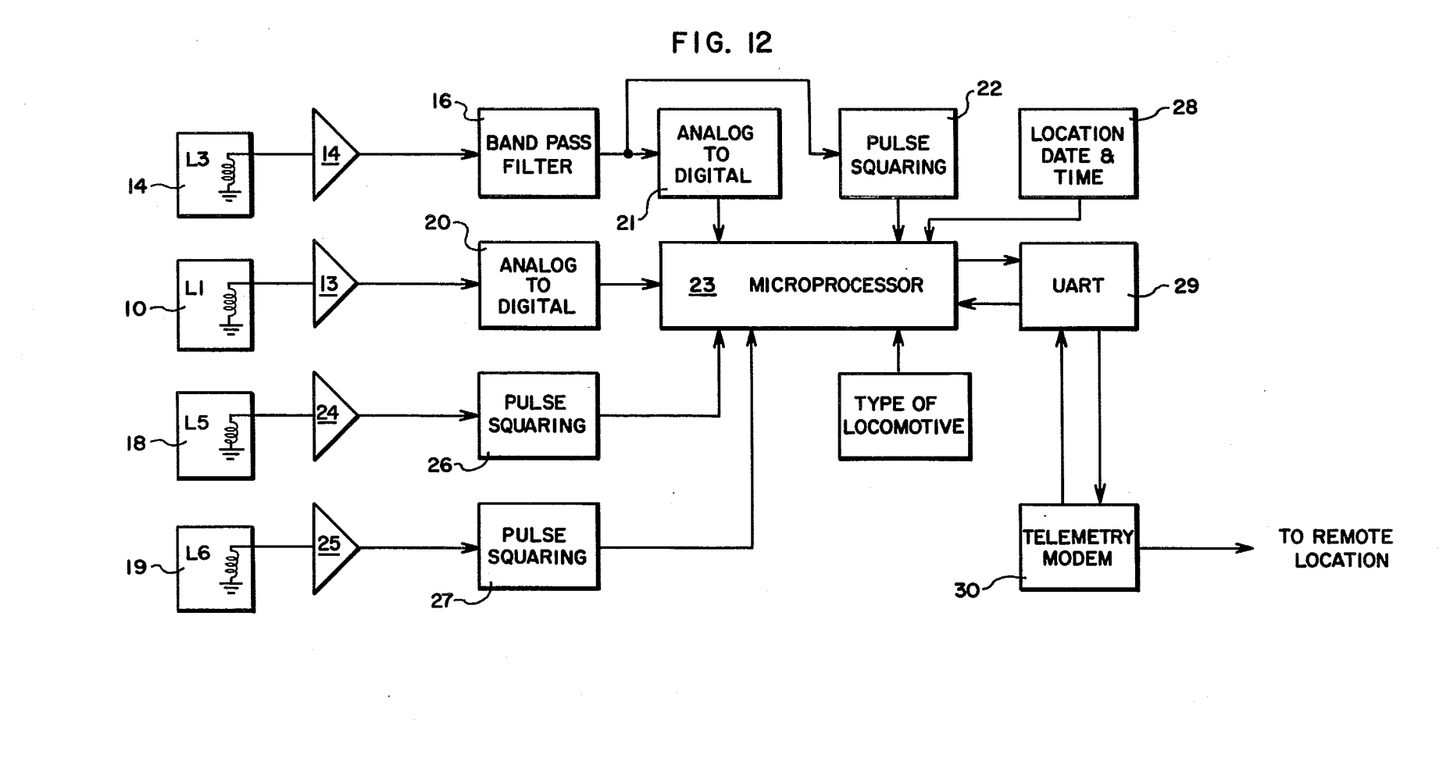
FIG. 12, a block diagram showing how a computer can be utilized for processing signals fed by the several sensors shown in FIG. 1.

For such evaluation, many possibilities exist as to the type of computer that can be used and the particular signal processing necessary to convert analog signals from the sensing means to computer compatible signals. FIG. 12 is a block diagram showing how a microcomputer can be utilized for such computer evaluation.

The signal from sensing coil L1 (a sensor 10) is amplified by an amplifier, such as that shown and described for FIG. 3, block 16. The amplified signal is then sent to an analog-to-digital converter 20, such as a Datel Systems, Inc. MDAS-16, which produces a microprocessor-compatible, digital output indicative of the amplitude of the signal from the sensor.

The signal from sensing coil L3 (a sensor 14) is amplified, such as by the instrument amplifier shown in block 14, FIG. 3, and filtered, such as by the capacitively-coupled amplifier shown in block 16, FIG. 3. Any filter designed to eliminate D.C. signals and A.C. signals below about 20 cycles per second and to pass at least A.C. signals in the band from 20 to 150 cycles per second is satisfactory. The amplified and filtered signal is fed to an analog-to-digital converter 21 similar to that described for 20. This could easily be the same analog-to-digital converter multiplexed to handle both signals. The amplified and filtered signal is also sent to pulse-squaring circuitry 22, which produces a pulse for each oscillation of the signal from coil L3.

The digital amplitude signals from the analog-to-digital converter and the signals from the pulse-squaring circuitry are fed as inputs to a microcomputer module 23, such as a Texas Instruments TM 990/100 m which includes a Texas Instruments TMS 9900 microprocessor.

To properly analyze the signals from the sensors, the computer must know the type of locomotive being sensed and the speed of the locomotive as it passes the sensors. The information as to the type of locomotive must be put into the computer from an outside source, such as by a human train dispatcher, or could be obtained and entered into the computer by automatic car-identification equipment currently used on some railroads.

The speed of the locomotive can be entered into the computer by feeding the information in a manner similar to the entering therein of information as to the type of units, or the speed may be determined and proper signals fed into the computer by a speed detecting means or by a special computer employed for the purpose. For example, as shown in FIG. 1, respective sensors 18 and 19 are placed between the rails 11 at respective locations spaced longitudinally along the tracks in opposite directions from sensor 10. These additional sensors may be relay coils identical to those normally forming sensors 10 and 14 and are represented by coils L5 and L6 in FIG. 12. These sensors will produce signals similar to the signals produced by sensors 10 and 14. Such signals are amplified by amplifiers 24 and 25, respectively, which may be identical to the amplifier described for block 16, FIG. 3, in connection with coil L1, and the amplified signals are sent to pulse-squaring circuitry 26 and 27. The squared pulses are fed as inputs to the microcomputer, which can be programmed to measure the time between a pulse received from the first sensor and the pulse subsequently received from the other sensor. Then, knowing the distance between these two sensors, the speed of the train is calculated by the computer and is used in analyzing the magnetic field data.

It is desirable that any output from the computer identify its location, data, and time of day. For this purpose, a unit 28 is provided to supply this information to the computer. Unit 28 may be a digital calendar clock with an additional fixed-location code.

The computer is programmed to compare the amplitude for each signal from sensor 10(coil L1), representing the magnetic field of each traction motor of a locomotive, with the signals for other traction motors for that same locomotive to determine if the amplitudes are substantially consistent and to compare the amplitudes to a normal value for that type of locomotive at its speed and for its gear ratio. From this comparison, the computer determines whether or not the traction motors of the locomotive are operating properly.

For example, the computer may be programmed to indicate by printout proper operation of the traction motors if the amplitude of the measured fields for all traction motors of the locomotive varies less than 20%. If the magnetic field of any one or more of the traction motors varies more than 20% from the others, the printout would indicate which traction motor or motors had the inconsistent readings and whether the readings were high or low. Thus, the printout from the computer for a locomotive might be: "check number 5 traction motor, low reading."

If any or all of the magnetic field readings for the traction motors of a locomotive are below the normal reading for that locomotive with a given gear ratio at the speed the locomotive is traveling (the standard values would be entered and stored in the computer memory and retrieved by the central processing unit when it was given the information as to locomotive type and speed) this would also be indicated by the printout, such as: "all traction motors reading below standard." Such an indication, without an indication that the readings for one or more particular traction motors are significantly lower than the readings for the remaining traction motors, indicates a fuel, excitation, or diesel engine speed problem.

The computer is also programmed to compare the amplitude of the magnetic field sensed by sensing means 14 for the main generator with a standard for that type of locomotive and to calculate the revolutions per minute of the diesel engine from the pulses generated by pulse squaring circuitry 22. The frequency of the pulses is the frequency of the main generator, which is converted to RPM as previously explained.

The RPM of the engine is compared to the standard for the engine of that type of locomotive at the throttle setting (as explained, the analyzer will usually be located where all locomotives passing it will be at full throttle), and an indication is given in the printout if the measured RPM varies significantly from the standard. A low RPM reading can indicate bad control cables between locomotives, bad main generator excitation, or a bad governor, while a high RPM reading can indicate a bad governor or stuck injectors.

An amplitude reading significantly lower than the standard for a particular type of locomotive at a certain RPM (standard value will be for full throttle RPM and the RPM reading will indicate if the problem is in RPM) can indicate bad excitation or a dirty fuel filter. A high reading can indicate a bad governor.

The output of the computer may be connected directly to a printer which will produce the computer printout, or as shown in FIG. 12, the computer output may be connected to a UART unit 29 which converts the computer output into serial form for transmission to remote locations. The output of the UART unit is connected to a telemetry modem 30 which transmits the computer output information either by wire, such as by phone lines, or by radio, to a remote location such as the railroad's central dispatching office or central shops where the received information is printed out.

Figure 13:
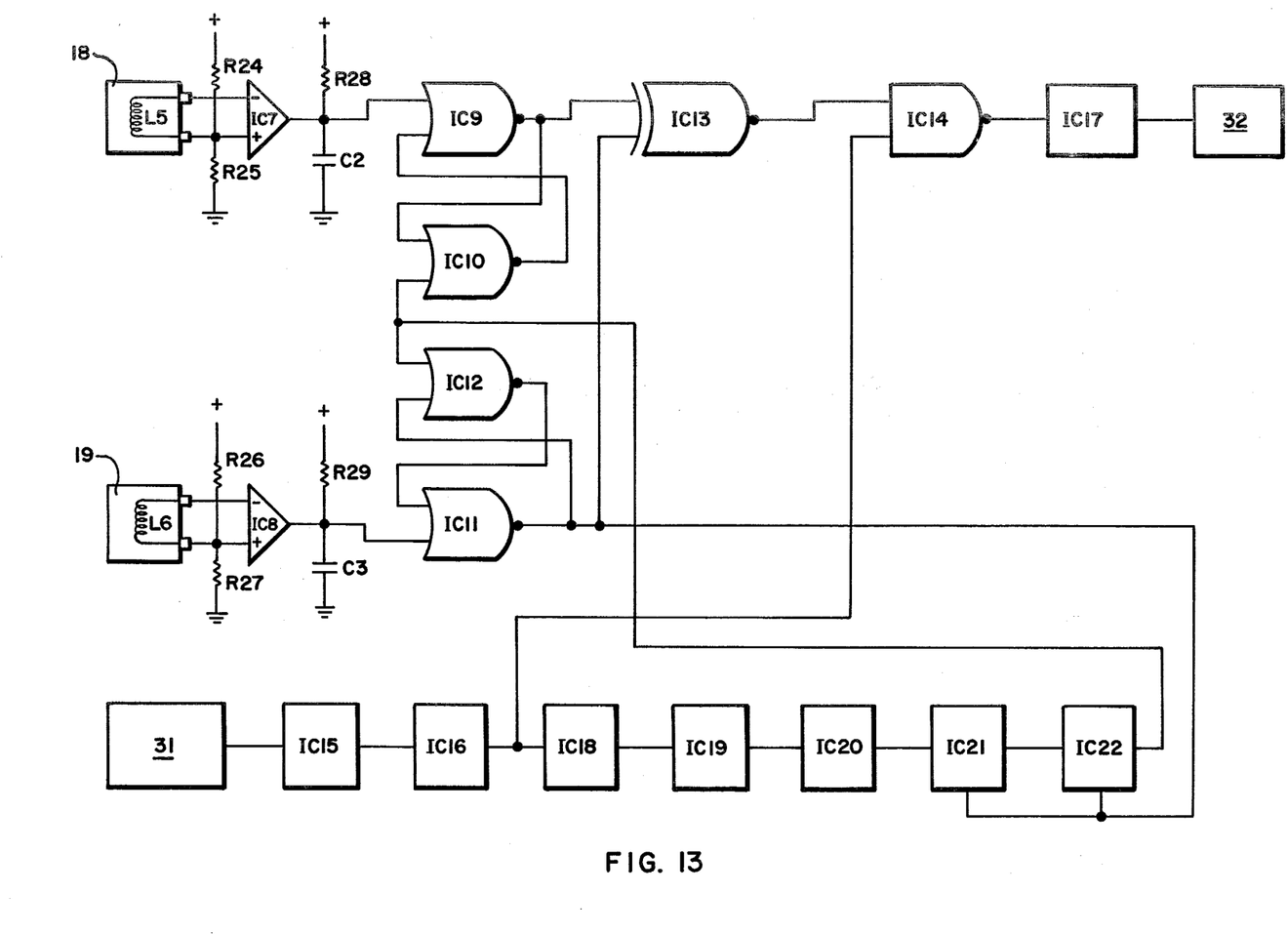
FIG. 13, an electrical circuit diagram applicable to the speed-determining portion of FIG. 12 if the output is fed into the microprocessor of FIG. 12, or useful with the oscillograph charts of FIGS. 4 through 11 if provided with a readout indicative of particular speeds.

A convenient speed detecting and measuring means, which may be used either with a computer or a direct speed readout in conjunction with oscillograph outputs, is shown in FIG. 13.

The sensing means 18 and 19, FIG. 1, represented by coils L5 and L6, FIG. 13, are located 5.28 feet (one thousandth of a mile) apart. The signals from the coil L5 are sent to voltage comparator IC7 and the signals from coil L6 are sent to voltage comparator IC8. Resistors R24 and R25, and R26 and R27 are bias resistors for IC7 and IC8 respectively. The voltage comparators are of the open collection type and produce a square wave when they receive a positive pulse from the respective sensors. Resistors R28 and R29 are bias resistors for the open collector outputs of IC7 and IC8, respectively. Capacitors C2 and C3 are provided to prevent oscillations in the circuitry.

IC7 and IC8 may be National Semiconductor LM339 or LM139 comparators, R24 and R26 are 10 K ohms. R25 and R27 are 2 K ohms. R28 and R29 are 3.3 K ohms. C2 and C3 are 0.1 microfarads.

The output of comparator IC7 is sent to AND gate IC9 which is connected to AND gate IC10 to form a reset-set flip-flop. The output of IC9 is normally high (positive output). When a signal (positive pulse) from IC7 is received, the output of IC9 goes low (zero output) and remains low until the flip-flop is reset by a signal to IC10 as described below.

The output of comparator IC8 is sent to AND gate IC11, which is connected with AND gate IC12 to form a second reset-set flip-flop. A signal from IC8 causes the output IC11 to go low and remain low until the flip-flop is reset by a signal to IC12.

The AND gates may be National Semiconductor LM7402's.

The outputs of IC9 and IC11 are connected to an exclusive-or gate IC13, such as a National Semiconductor LM7486. IC13 produces a positive output only when one input from either IC9 or IC11 is high and the other low. When both are high or both are low, the output of IC13 is low.

The output of IC13 is sent to an input of NAND gate IC14, which may be a National Semiconductor LM7400. The other input to IC14 is connected to a source of thousand cycle pulses. The source of thousand cycle pulses comprises a standard, one hundred thousand cycle, crystal oscillator 31, connected to binary coded decimal counters IC15 and IC16 arranged in series, which each act to divide the frequency by 10. The output of IC16 is, thus, a one thousand cycle string of pulses which is sent to one input of IC14.

When the output of IC13 is high, the output of IC14 will be the thousand cycle pulses. The pulses are sent to counter IC17.

When a locomotive passes either sensors 18 or 19, the associated flip-flop output goes low, causing a high output from IC13 and causing the output of IC14 to be a series of thousand cycle pulses. The pulses are counted by counter IC17, and the count is displayed or printed out by output means 32, or may be an input to a computer. When the locomotive passes the second sensing means, the associated flip-flop goes low, causing both inputs to IC13 to be low and the output to be low. This causes the output of IC14 to be low (no more pulses). The number of pulses counted is the number of milliseconds of time it took the engine to pass between the two sensors, and that number divided into 3600 gives miles per hour. The count of pulses may be displayed or printed out by output means 32 or may be an input to a computer. The output means could include means to convert the count directly to miles per hour before display or printout.

Both inputs to IC13 remain low until the flip-flops are reset, at which time both inputs become high. It is desirable to obtain a single speed reading per train as the lead locomotive passes over the sensors, and therefore a delay is provided before the flip-flops are reset. The frequency of the thousand cycle pulses is further divided (by ten each time) by BCD counters IC18, IC19, and IC20. The output of IC20 is a pulse every second. The output of IC20 is sent to binary counters IC21 and IC22 connected in series, each of which divide the frequency by 16. Counters IC21 and IC22 are connected to the output of IC11 and begin to count only when the output of IC11 goes low. Thus, when a train passes sensor L6 causing the output of IC11 to go low, counters IC21 and IC22 count the one cycle per second pulses from IC19. IC22 produces an output two hundred and fifty-six seconds, or 4.27 minutes, later. This output resets the flip-flops and the circuitry is again ready to determine speed.

The amount of time delay before reset of the flip-flops may be easily adjusted by adding additional counters in series with IC21 and IC22 for longer delay or by requiring a lesser count for shorter delay. The desired delay will usually be long enough to allow a complete train to pass over the sensors before the circuitry is reset, but short enough so that a closely following train will not be missed.

The apparatus described above and the procedures utilized are easily adaptable by those skilled in the art for use with automotive vehicles utilizing traction motors as power propulsion means in connection with the axles or individual wheels of the vehicles and employing diesel or other types of internal combustion engines to power electrical generators carried by the vehicles. The sensors used will be similar, as will their location with respect to a roadway along which the vehicles travel.

Whereas this invention is here illustrated and described with specific reference to embodiments thereof contemplated as the best mode of carrying out the invention in actual practice, it is to be understood that various changes may be made without departing from the broader inventive concepts disclosed herein and comprehended by the claims that follow.

I claim:

1. A method of determining performance characteristics of electric-traction-motor powered vehicles and electrical operating components thereof which produce magnetic fields during operation, comprising sensing the magnetic field of at least one of said electrical operating components from a stationary position outside of and not connected with the vehicle concerned as such vehicle passes said position, to thereby yield an electrical signal indicative of the magnetic field sensed; and processing said signal to yield a perceptible output representative of said magnetic field and indicative in general of any maintenance work that must be done to maintain optimum operating performance.

2. A method as set forth in claim 1, wherein a plurality of magnetic fields produced by respective electrical operating components are sensed to yield respective signals; and wherein the respective signals are separately processed to yield separate perceptible outputs.

3. A method as set forth in claim 1, wherein the speed of the vehicle during the sensing time is ascertained and taken into consideration during signal processing.

4. A method as set forth in claim 1, wherein the sensing is carried out by means of one or more coils of wire so that the signals are momentary electrical currents induced in the respective coils by passage thereby of the magnetic fields.

5. A method as set forth in claim 1, wherein processing of the signals is carried out by first amplifying such signals and then converting them to readable charts by means of an oscillograph.

6. A method as set forth in claim 1, wherein processing of the signals is carried out by computer equipment.

7. A power propulsion system performance analyzer for vehicles having electric traction motors, comprising a pathway for vehicle travel; stationary sensing means located in proximity to said pathway and positioned to sense magnetic fields produced by at least one selected operating electrical component of the propulsion systems of respective ones of said vehicles as they pass said sensing means and to produce respective signals in response to and indicative of the magnetic fields sensed; and means for processing said signals to produce respective perceptible outputs representative of said magnetic fields and indicative in general of performance of respective electrical operating components of the vehicle whose magnetic fields were sensed and of any maintenance work that must be done to maintain optimum operating performance.

8. An analyzer as set forth in claim 7, wherein the means for processing the signals from the sensing means includes an amplifier for the signals and an oscillograph for recording the amplified signals on charts for visual inspection.

9. An analyzer as set forth in claim 7, wherein the means for processing the signals from the sensing means includes computer equipment.

10. An analyzer as set forth in claim 7, wherein the sensing means comprise one or more coils of wire so that the signals are momentary electrical currents induced in the respective coils by passage thereby of the magnetic fields.

11. An analyzer according to claim 7, wherein the pathway is a railroad track and vehicles to be analyzed are diesel electric or all-electric locomotives.

12. An analyzer according to claim 11, wherein one of the electrical operating components to be analyzed is an electrical traction motor and the sensor for sensing the magnetic field produced by the traction motor is positioned between the rails of the track.

13. An analyzer according to claim 11, wherein one of the electrical operating components to be analyzed is a main generator of alternator type or a cooling fan motor and the sensor for sensing the magnetic field produced by said main generator or said fan motor is positioned at an elevated location alongside the track which is approximately at the level of travel of said main generator or fan motor.

* * * * *